US010109933B2

(12) United States Patent
Stadler

(10) Patent No.: US 10,109,933 B2
(45) Date of Patent: Oct. 23, 2018

(54) ELECTRICAL CONTACT ASSEMBLY OF A PLUG-IN CONNECTION TERMINAL

(71) Applicant: MCQ TECH GmbH, Blumberg (DE)

(72) Inventor: Hermann Stadler, Donaueschingen (DE)

(73) Assignee: MCQ Tech GmbH, Blumberg (DE)

( * ) Notice: Subject to any disclaimer, the term of this patent is extended or adjusted under 35 U.S.C. 154(b) by 0 days.

(21) Appl. No.: 15/685,767

(22) Filed: Aug. 24, 2017

(65) Prior Publication Data

US 2018/0062289 A1 Mar. 1, 2018

(30) Foreign Application Priority Data

Aug. 26, 2016 (DE) .................... 20 2016 104 708 U

(51) Int. Cl.

| | |
|---|---|
| ***H01R 4/48*** | (2006.01) |
| ***H01R 9/26*** | (2006.01) |
| ***H01R 13/11*** | (2006.01) |
| ***H01R 12/71*** | (2011.01) |
| ***H01R 13/24*** | (2006.01) |

(52) U.S. Cl.

CPC ............. *H01R 4/4818* (2013.01); *H01R 4/48* (2013.01); *H01R 4/4809* (2013.01); *H01R 4/4836* (2013.01); *H01R 9/26* (2013.01); *H01R 12/716* (2013.01); *H01R 13/111* (2013.01); *H01R 13/2435* (2013.01); *H05K 999/99* (2013.01)

(58) Field of Classification Search

CPC ................................ H01R 9/26; H01R 4/4818

See application file for complete search history.

(56) References Cited

U.S. PATENT DOCUMENTS

| | | | | |
|---|---|---|---|---|
| 3,555,493 A * | 1/1971 | Baumanis | H01R 12/721 | 439/636 |
| 3,720,907 A * | 3/1973 | Asick | H01R 13/428 | 439/636 |
| 4,371,228 A * | 2/1983 | Chalmers | H01R 13/428 | 439/637 |

(Continued)

FOREIGN PATENT DOCUMENTS

| | | |
|---|---|---|
| DE | 102006016354 | 10/2007 |
| EP | 2645488 | 10/2013 |

OTHER PUBLICATIONS

European Patent Office, "Search Report" issued in European patent application No. 17 18 1874, document of 12 pages, dated Dec. 15, 2017.

*Primary Examiner* — James Harvey

(74) *Attorney, Agent, or Firm* — Akerman LLP; Peter A. Chiabotti

(57) ABSTRACT

The present disclosure relates to an electrical contact assembly of a plug-in connection terminal, which has an electrical contact having a first connector element for connecting a plug-in contact in a plug-in direction, a second connector element for connecting an electrical conductor in a clamping manner being arranged on the electrical contact, the first connector element having at least one contact element that has at least one first section and one second section, the width of the first section at a right angle to the plug-in direction being greater than the width of the second section at a right angle to the plug-in direction.

20 Claims, 7 Drawing Sheets

(56) References Cited

U.S. PATENT DOCUMENTS

| | | | | |
|---|---|---|---|---|
| 4,454,651 | A * | 6/1984 | Caveney .............. | H01R 4/2445 29/749 |
| 5,415,563 | A * | 5/1995 | Shan .................... | H01R 4/4818 439/439 |
| 2006/0286839 | A1 * | 12/2006 | Bethurum ............ | H01R 4/4818 439/188 |
| 2007/0093121 | A1 * | 4/2007 | Helmreich ............. | H01H 50/14 439/495 |
| 2007/0238303 | A1 | 10/2007 | Walter et al. | |
| 2008/0032566 | A1 * | 2/2008 | Walter ................. | H01R 4/4836 439/721 |
| 2012/0295495 | A1 | 11/2012 | Wu | |
| 2015/0249295 | A1 * | 9/2015 | Tseng ................... | H01R 4/4818 439/668 |
| 2015/0303594 | A1 * | 10/2015 | Stadler ................. | H01R 4/4836 439/729 |

* cited by examiner

PRIOR ART

ELECTRICAL CONTACT ASSEMBLY OF A PLUG-IN CONNECTION TERMINAL

CROSS-REFERENCE TO RELATED APPLICATIONS

This application claims priority to German Patent Application No. 20 2016 104 708.0, filed Aug. 26, 2016, which is incorporated by reference in its entirety.

BACKGROUND

The present disclosure relates to an electrical contact assembly of a plug-in connection terminal having the features and structures recited herein.

SUMMARY

Electrical contact assemblies of plug-in connection terminals that have an electrical contact having a first connector element for connecting a plug-in contact in a plug-in direction, wherein a second connector element for connecting an electrical conductor in a clamping manner is arranged on the electrical contact, are known. The plug-in connection terminals are distinguished by the fact that they have a terminal connection for connecting an electrical conductor on the one hand and that they can make contact with the electrical device or the like by means of a connecting point into which the plug-in contact is simply plugged on the other hand.

Also known are plug-in printed circuit board connection terminals that have a multiplicity of connection terminals of this type for connecting a plurality of plug-in contacts that are fixed relative to each other on a pin header by means of an insulator. To design printed circuit board connection terminals of this type for certain nominal voltages, corresponding clearances and creepage distances are to be complied between the electrically conductive parts. To nevertheless be able to keep the spacing between the individual plug-in connection terminals of the printed circuit board connection terminal as small as possible, it is a known practice to arrange the plug-in contacts of the pin header, not in one plane, but in two planes arranged at a distance and offset with respect to each other in parallel, the plug-in contacts being arranged alternatingly in the various planes such that a zig-zag arrangement of the plug-in contacts is formed. To enable the plug-in contacts to be contacted accordingly in the printed circuit board connection terminal, it is a known practice to arrange two different electrical contact assemblies in an alternating manner in the printed circuit board connection terminal.

FIGS. 1 and 2 show examples of known electrical contact assemblies of this type according to the prior art. They have an electrical contact 80 having a first connector element 82 for connecting a plug-in contact 50 in a plug-in direction S, a second connector element 86 for connecting an electrical conductor in a clamping manner being arranged on electrical contact 80. Second connector element 86 has, for example, a spring leg 88 for connecting the electrical conductor in a clamping manner between spring leg 88 and electrical contact 80. First connector element 82 has, for example, two spring elements 84 that are arranged approximately in mirror symmetry with respect to each other and its longitudinal axis runs, in particular, approximately parallel to plug-in direction S. The free ends of spring elements 84 open towards plug-in direction S. The width of spring elements 84 approximately corresponds to the diameter of the plug-in contact 50 to be connected. To enable the plug-in contacts 50 arranged on a pin header in a zig-zag to be contacted in the printed circuit board connection terminal, first connector elements 82 of the two electrical contacts 80 shown in FIGS. 1 and 2 are arranged offset relative to each other by a distance a at a right angle to plug-in direction S. Distance a approximately corresponds to the spacing of the two planes in which the plug-in contacts are arranged on the pin header. This means in particular that first connector element 82 of the electrical contact assembly shown in FIG. 1 is arranged closer to a side wall of electrical contact 80 than first connector element 82 of electrical contact assembly 80 shown in FIG. 2.

The production and installation of a known printed circuit board connection terminal of this type is costly because two different types of electrical contact assemblies need to be produced and, in particular, installed in the right order.

The object of the present disclosure is therefore to provide an electrical contact assembly of a plug-in connection terminal that simplifies the production and installation of a plug-in printed circuit board connection terminal.

The object is achieved according to the i present disclosure by an electrical contact assembly of a plug-in connection terminal having the features and structures recited herein.

Advantageous embodiments and developments of the present disclosure are also disclosed herein.

The contact assembly of a plug-in connection terminal according to the present disclosure, which has an electrical contact having a first connector element for connecting a plug-in contact in a plug-in direction, a second connector element for connecting an electrical conductor in a clamping manner being arranged on the electrical contact, is characterized in that the first connector element has at least one contact element that has at least one first section and one second section, the width of the first section at a right angle to the plug-in direction being greater than the width of the second section at a right angle to the plug-in direction. A design of this type for the contact element makes it possible to contact plug-in contacts arranged in various positions at a right angle to the plug-in direction such that only a single type of electrical contact assembly is enough to contact the plug-in contacts in the various positions. It is thus only necessary to produce a single type of electrical contact assembly, which simplifies the production of the electrical contact assemblies. The installation of the plug-in printed circuit board connection terminal is also simplified because only one type of electrical contact assembly needs to be installed.

According to a preferred embodiment of the present disclosure, the plug-in contact can be plugged into the electrical contact assembly at two positions spaced by a distance a at a right angle to the plug-in direction, and the width of the first section is at least as great as the distance a plus the diameter of the plug-in contact to be connected, especially preferably, at least as great as the distance a plus double the diameter of the plug-in contact to be connected. In this manner, reliable contacting can be ensured in all possible positions of the plug-in contact.

The width of the first section is preferably at least twice as great, preferably three times as great, as the diameter of the plug-in contact to be connected to make reliable contacting of the plug-in contact possible in each of the possible positions.

The first section preferably comprises the area of the contact element that rests against the plug-in contact when the plug-in contact is plugged in to ensure reliable contacting.

The contact element is preferably designed as a spring element having a free end, for example, in the form of a leaf-spring-like spring element. Spring elements of this type are of particularly simple structure in terms of design and can be manufactured inexpensively.

The first section is preferably arranged in the area of the free end to further improve contacting.

According to an advantageous further embodiment of the present disclosure, the free ends of the spring elements are curved away from the plug-in contact which is to be connected, which can simplify the connection of the plug-in contact.

According to a preferred embodiment, the longitudinal axes of the spring elements run approximately parallel to the plug-in direction of the plug-in contact, as a result of which the reliability of the contacting can be increased.

A preferred embodiment of the present disclosure provides that the first connector element has at least one pair of contact elements to further improve contacting.

Particularly preferably, the electrical contact has a side wall in which a first contact element of the pair of contact elements is arranged, a connection element, on which a second contact element of the pair of contact elements is arranged, being arranged essentially perpendicular to the side wall. A design of this type enables a structure of simple design and also, if desired, a one-piece design of the electrical contact.

A particularly preferred embodiment of the present disclosure provides that the first connector element has at least two pairs of contact elements arranged one behind the other in the plug-in direction of the plug-in contact. An arrangement of this type allows reliable contacting of the plug-in contact, even under extreme conditions, such as high vibrations or the connecting or disconnecting of the plug-in contact under load.

Each of the pairs of contact elements preferably has two spring elements that are arranged relative to each other in such a way that they rest against two diametrically opposite points of the plug-in contact when the plug-in contact is connected, which can further increase the contact reliability.

The free ends of the spring elements of the first pair of contact elements in the plug-in direction of the plug-in contact and the free ends of the spring elements of the second pair of contact elements in the plug-in direction of the plug-in contact preferably face towards each other. This permits a short distance between the contact points arranged one behind the other in the plug-in direction of the plug-in contact.

A preferred embodiment of the present disclosure provides that the electrical content has a side wall in which a first contact element of the first pair of contact elements in the plug-in direction of the plug-in contact and a first contact element of the second pair of contact elements in the plug-in direction of the plug-in contact are arranged, and that a first connection element, on which a second contact element of the first pair of contact elements in the plug-in direction of the plug-in contact is arranged, is arranged essentially perpendicular to the side wall, and that a second connection element, on which a second contact element of the second pair of contact elements in the plug-in direction of the plug-in contact is arranged, is arranged essentially perpendicular to the side wall. In a simple manner, this makes a structure of simple design possible for the electrical contact.

According to a preferred embodiment of the present disclosure, the second connector element has a spring leg, by means of which clamping contacting of a conductor to be connected is made possible in a simple manner.

According to a particularly preferred embodiment of the present disclosure, the electrical contact has a one-piece design, which allows the electrical contact to be manufactured simply and cost-effectively.

Particularly preferably, the electrical contact is designed as a stamping and bending element, which allows the electrical contact to be manufactured simply and cost-effectively.

A connection terminal according to the present disclosure has an electrical contact assembly according to the present disclosure. In particular, a printed circuit board connection terminal according to the present disclosure has a plurality of electrical contact assemblies according to the present disclosure.

BRIEF DESCRIPTION OF THE DRAWINGS

The present disclosure will be described in detail based on the exemplary embodiment shown in the figures below. Shown are.

DETAILED DESCRIPTION

In the figures, identical reference numbers denote identical parts. For the sake of clarity, not all reference numbers are shown in all of the figures.

Figure 1:
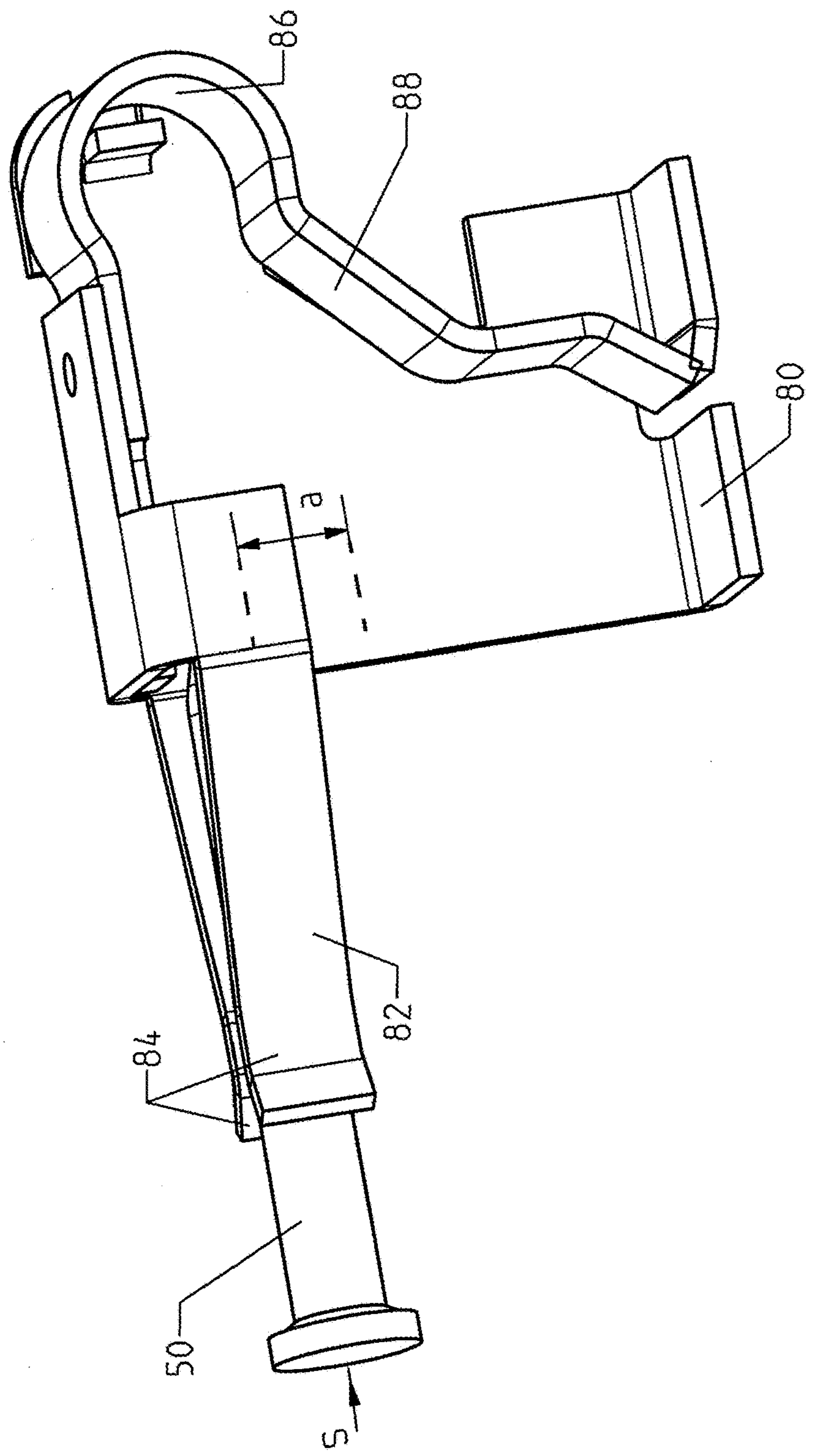
FIG. 1 a perspective view of an exemplary embodiment of an electrical contact assembly according to the prior art having an inserted contact element, FIG. 2 a perspective view of another exemplary embodiment of an electrical contact assembly according to the prior art having an inserted plug-in contact, FIG. 3 a perspective view of an exemplary embodiment of an electrical contact assembly according to the present disclosure having a plug-in contact inserted in a first position, FIG. 4 a perspective view of the electrical contact assembly according to FIG. 3 having a plug-in contact inserted in a second position, FIG. 5 a perspective view of a printed circuit board connection terminal, FIG. 6 a perspective view of a pin header having a plurality of plug-in contacts, FIG. 7 a cross-section through the printed circuit board connection terminal according to FIG. 5 and FIG. 8 a perspective view of the contact assembly of the printed circuit board connection terminal according to FIG. 7.
Figure 2:
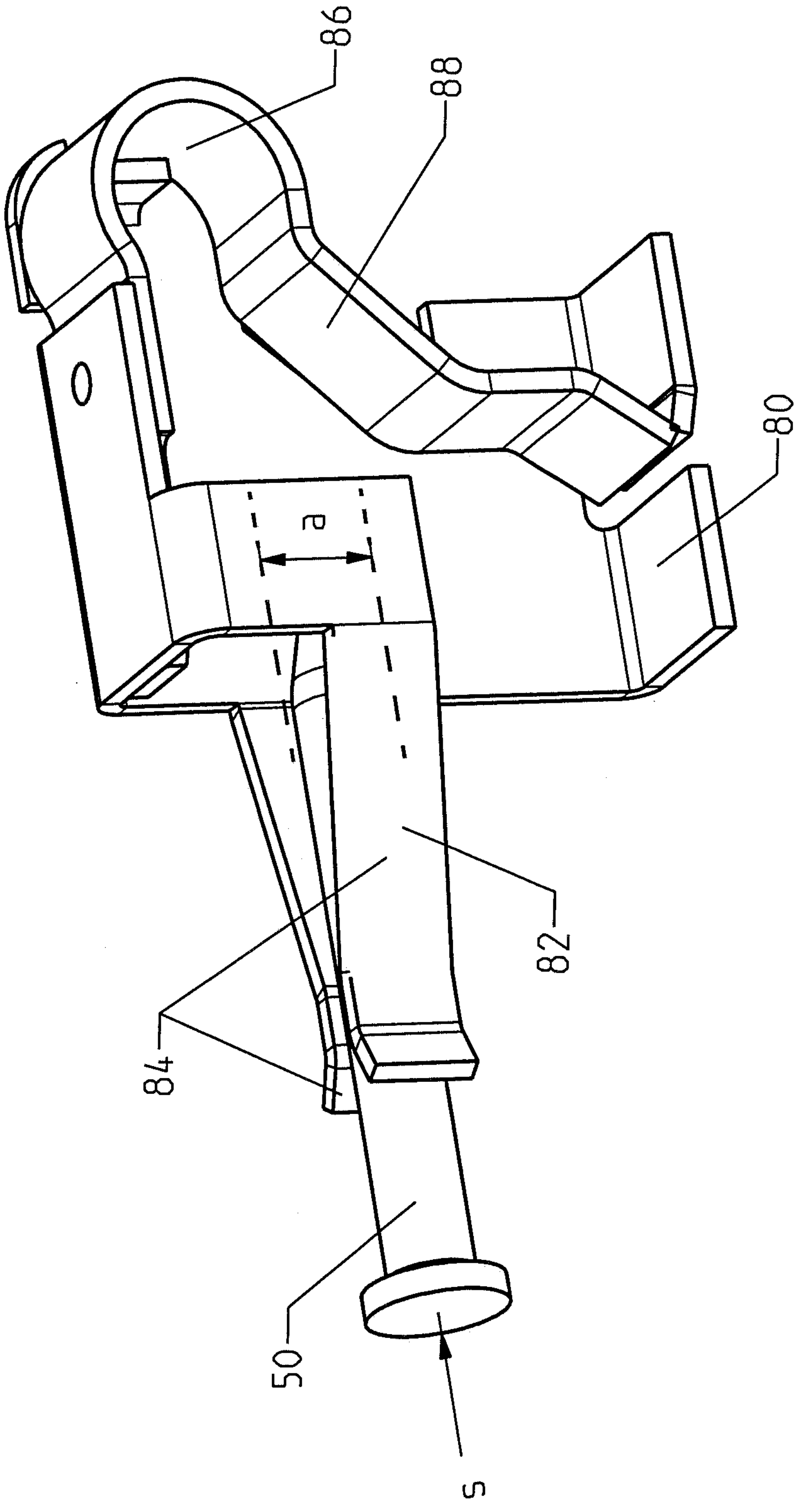
Figure 3:
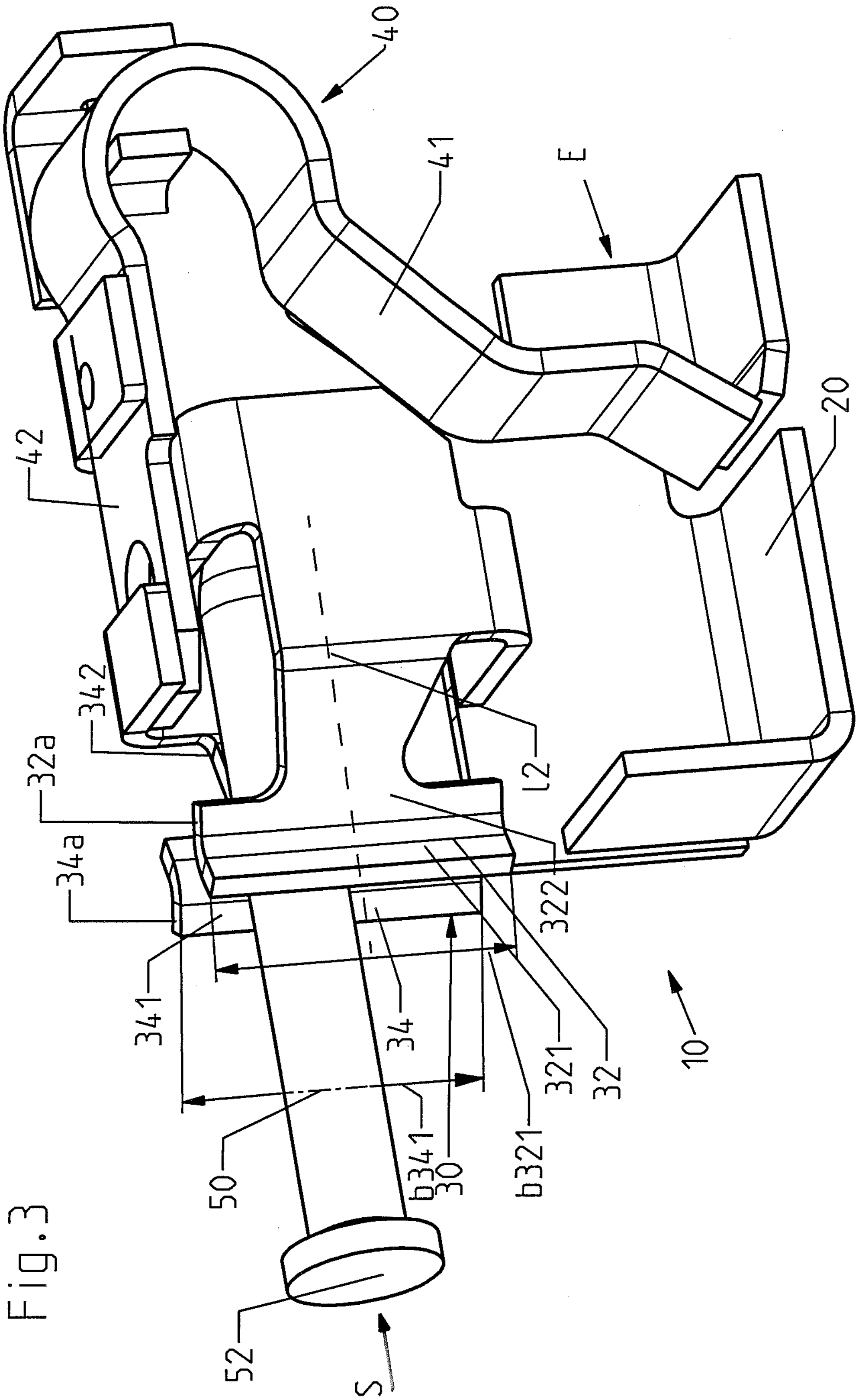
Figure 4:
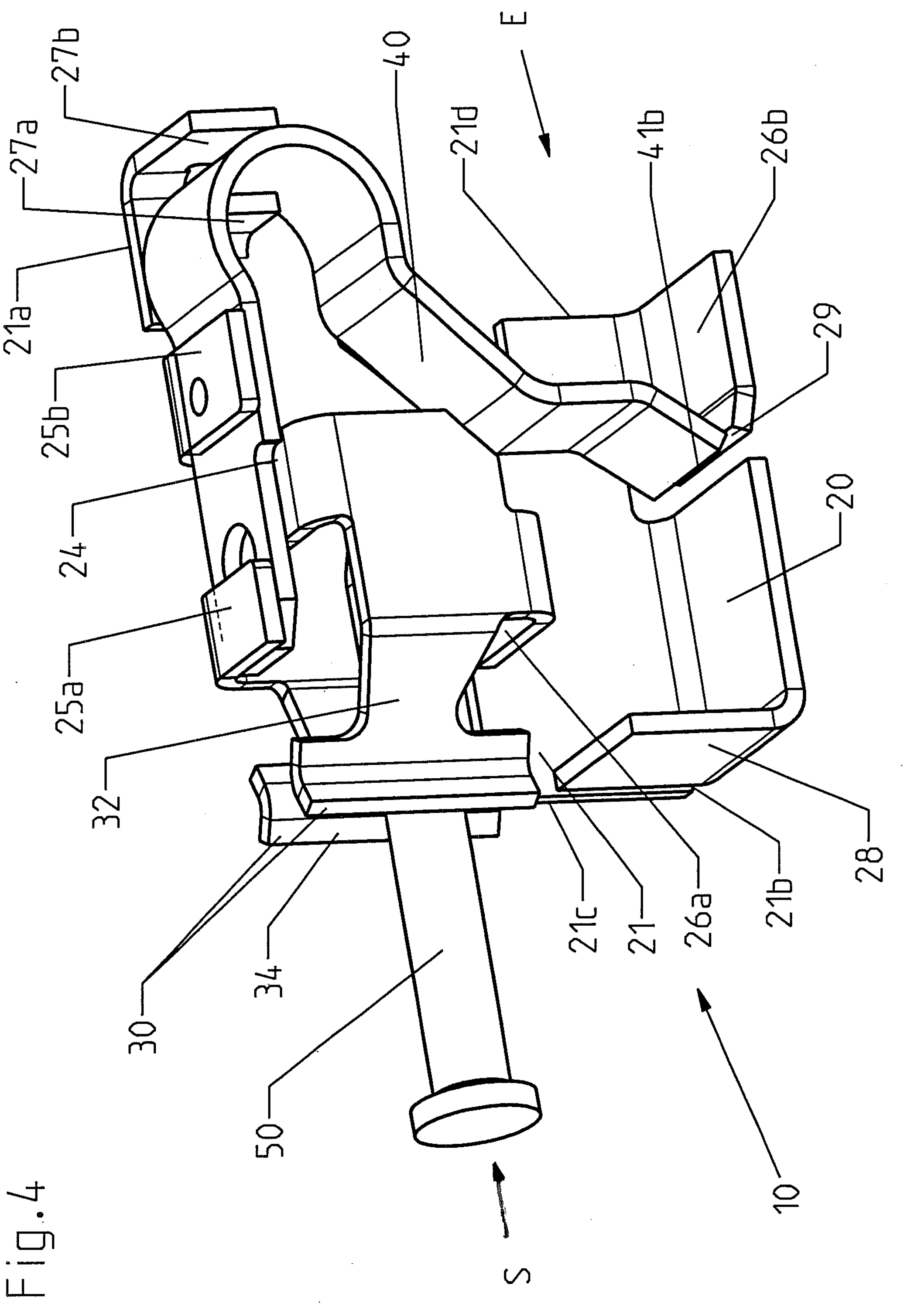

FIGS. 3 and 4 show a perspective view of an exemplary embodiment of an electrical contact assembly 10 according to the present disclosure into which a plug-in contact 50 was inserted along a plug-in direction S to illustrate the contacting of plug-in contact 50.

Figure 5:
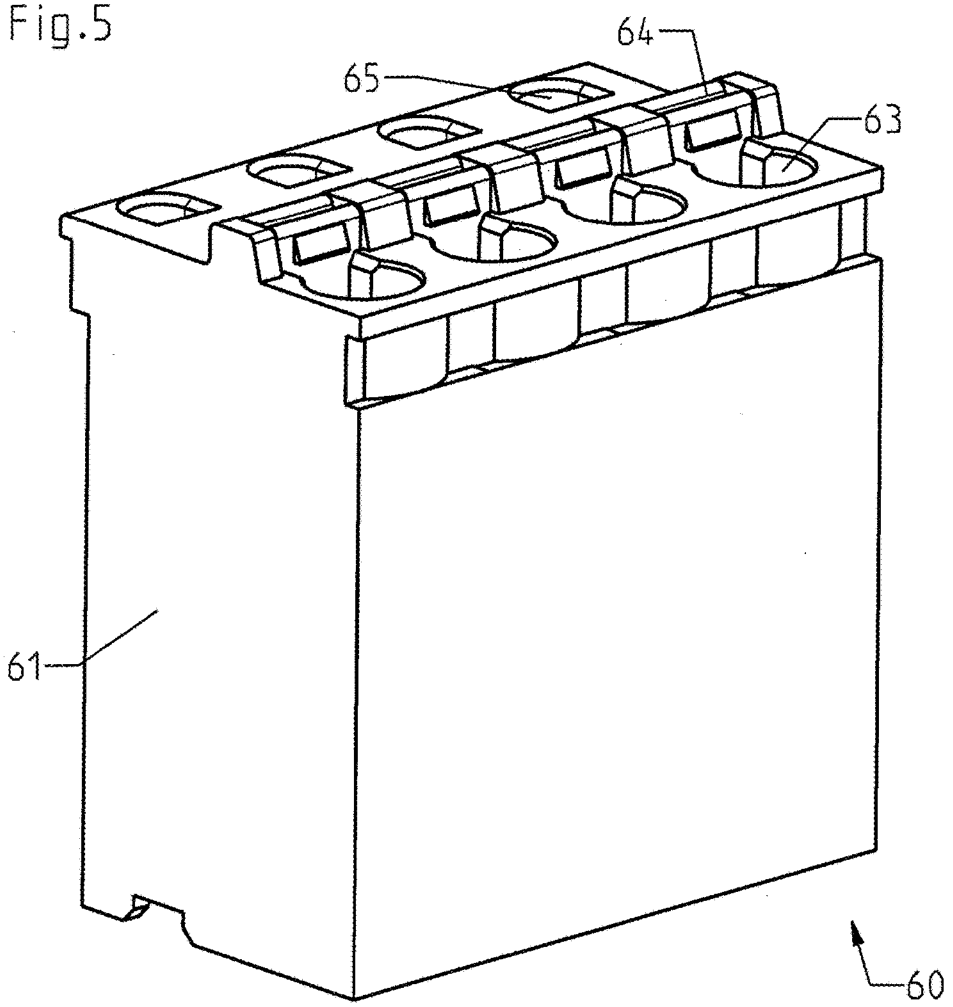
Figure 7:
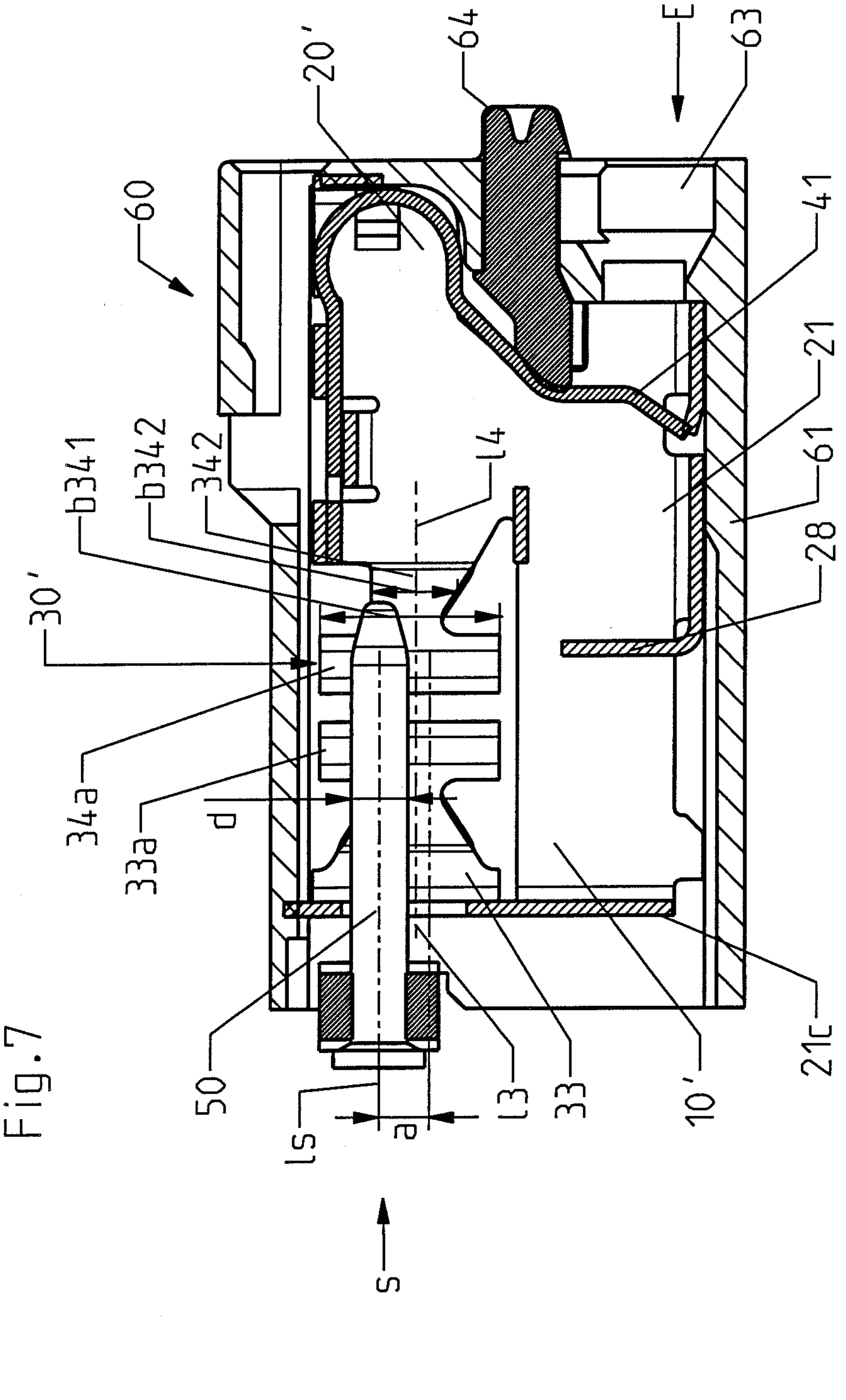
Figure 8:
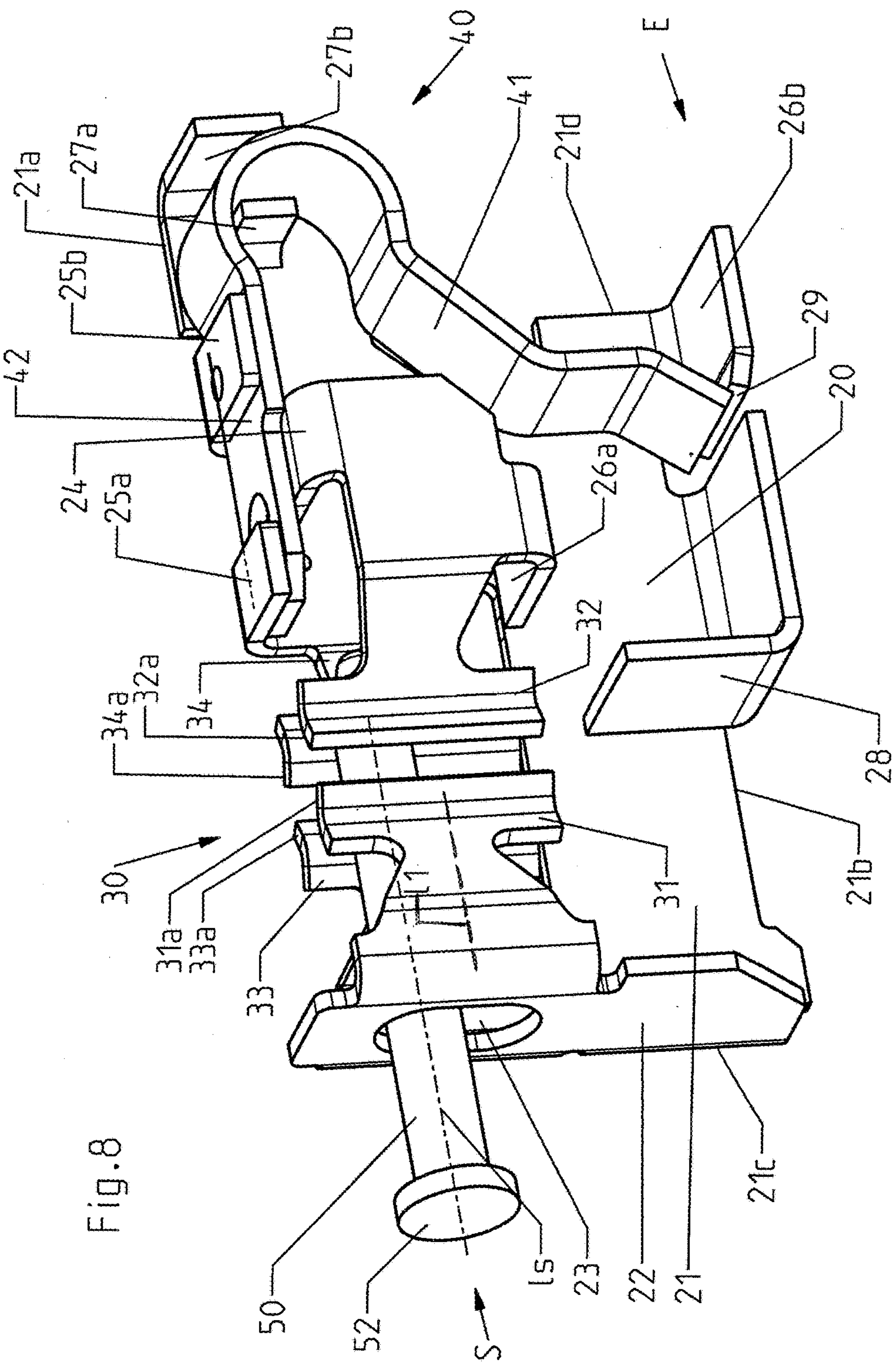

FIGS. 7 and 8 show a further exemplary embodiment of an electrical contact assembly 10' according to the present disclosure in a state in which it is installed in a printed circuit board connection terminal 60. FIG. 5 shows a perspective view of printed circuit board connection terminal 60.

Figure 6:
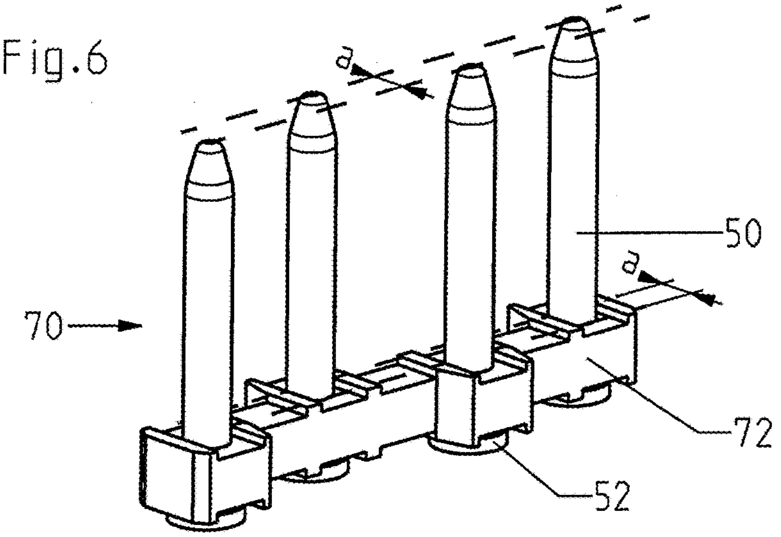

FIG. 6 shows a pin header 70 having an insulator 72 in which a plurality of plug-in contacts 50 are fixed relative to each other. Plug-in contacts 50 have a diameter d and a longitudinal axis 1S. Furthermore, plug-in contacts 50 can have a soldering surface 52 by means of which plug-in contact 50 can be connected to a device in an electrically conductive manner and fixedly attached thereto.

Plug-in contacts 50 are arranged on insulator 72 in two planes arranged offset with respect to each other by a distance a in parallel. Plug-in contacts 50 are arranged along insulator 72 in an alternating manner in the two planes such that a zig-zag arrangement of plug-in contacts 50 is formed along insulator 72. The spacing of adjacent plug-in contacts 50 can therefore be increased in comparison with an arrangement of the plug-in contacts in a single plane with the same grid dimension.

The contact assembly 10 shown in FIGS. 3 and 4 has an electrical contact 20 having a first connector element 30 for connecting plug-in contact 50. A second connector element 40 is arranged on electrical contact 20 for connecting an electrical conductor—which is inserted along an insertion direction E—in a clamping manner. Insertion direction E is arranged such that it is directed opposite to plug-in direction S.

Contact 20 is manufactured from an electrically conductive material. Contact 20 can be designed in one piece. Furthermore, contact 20 can be manufactured as a stamping and bending element.

First connector element 30 can have two contact elements that form a pair of contact elements and are designed in particular as spring elements 32, 34 having a longitudinal axis 12, 14. Longitudinal axes 12, 14 run parallel to one another in particular and approximately parallel to plug-in direction S. Each of spring elements 32, 34 has a free end 32*a*, 34*a*. Free ends 32*a*, 34*a* are designed in particular such that they are slightly curved in shape, in particular designed to be curved away from plug-in contact 50 to simplify the insertion of plug-in contact 50.

Spring elements 32 and 34 of the pair of contact elements are aligned relative to each other in such a way that longitudinal axes 12, 14 run essentially parallel to one another and are arranged parallel to plug-in direction S. A gap is arranged between the two spring elements 32, 34 and thus also between their longitudinal axis 12, 14 in such a way that plug-in contact 50 can be inserted between the two spring elements 32, 34 and spring elements 31, 33 bear against plug-in contact 50 under stress, in particular in such a way that the contact points are approximately diametrically opposite on plug-in contact 50. Free ends 32*a*, 34*a* of spring elements 31, 33 are in the front when viewed in plug-in direction S.

Spring elements 32, 34 each have a first section 321, 341 and a second section 322, 324, width b321, b341 of first section 321, 341 at a right angle to plug-in direction S being greater than width b322, b342 of second section 322, 324 at a right angle to plug-in direction S.

Plug-in contact 50 can be inserted into electrical contact assembly 10 at two positions spaced apart by distance a, which corresponds to the distance a between the two planes in which plug-in contacts 50 are arranged on pin header 70, at a right angle to the plug-in direction. The width b321, b341 of first section 321, 341 of spring elements 32, 34 is preferably at least as great as distance a plus diameter d of the plug-in contact 50 to be connected, preferably at least as great as distance a plus double diameter d of the plug-in contact 50 to be connected. For example, width b321, b341 of first section 321, 341 of spring elements 32, 34 can be at least twice as great, preferably three times as great as diameter d of the plug-in contact 50 to be connected. Width b322, b342 of the second section 322, 342 of spring elements 32, 34 can approximately correspond to diameter d of the plug-in contact 50 to be connected. For example, spring elements 32, 34 can have a T-shaped design.

First sections 321, 341 of spring elements 32, 34 comprise the area of spring elements 32, 34, which rests against plug-in contact 50 when plug-in contact 50 is plugged in, in particular free ends 32*a*, 34*a* of spring elements 32, 34. For example, spring elements 32, 34 can have a T-shaped design.

Spring elements 32, 34 can be arranged in one piece on contact 20. Contact 20 has a side wall 21 that has an essentially rectangular design with two longitudinal edges and two face edges 21*a*, 21*b* and two face edges 21*c*, 21*d*. Spring element 34 can be arranged in the side wall. For this purpose, side wall 21 has an essentially rectangular recess starting from longitudinal edge 21*a* and face edge 21*c* into which spring element 34 protrudes in such a way that its longitudinal axis 14 is arranged essentially parallel to longitudinal edge 21*a* and its free end 34*a* faces towards face edge 21*c*.

Starting from longitudinal edge 21*a*, a connection element 24, with spring element 32 being arranged essentially at a right angle to the plane of connection element 24 on its end facing away from side wall 21, can be arranged on side wall 21 essentially at a right angle to side wall 21. Spring element 32 is arranged in particular in such a way that it is arranged essentially parallel to spring element 34. In particular, spring elements 32, 34 are arranged in mirror symmetry with respect to each other.

A supporting surface 26*a* can be arranged on spring element 32 in such a way that it, in turn, is arranged essentially at a right angle to the surface of spring element 32 and is designed such that it runs towards the side wall 21, and in particular such that it extends up to side wall 21 and supports itself on it to stabilize spring element 32.

Second connector element 40 can be designed as a clamping spring element and, for this purpose, has a spring leg 41 having a free end 41*b* and a contact leg 42 arranged thereon that are arranged in particular essentially at an acute angle relative to each other. For the fixation of second connector element 40 to contact 20, two contact surfaces 25*a*, 25*b* can be arranged on side wall 21 starting from longitudinal edge 21*a*, in particular essentially perpendicular to side wall 21. Contact surfaces 25*a* are spaced apart from one another along longitudinal edge 21*a*, connection element 24 being arranged in particular in the intermediate space. Contact surfaces 25*a*, 25*b* and connection element 24 can be spaced at a right angle to the direction longitudinal edge 21*a* in such a way that contact leg 42 of second connector element 40 can be pushed between contact surfaces 25*a*, 25*b* and connection element 24 in such a way that contact surfaces 25*a*, 25*b* come into contact with one side of contact leg 42 and connection 24 on the opposite side of contact leg 42 to make it possible to fix contact leg 42 in place in this manner. For additional fixation of second connector element 40, two holding bars 27*a*, 27*b*, which are spaced apart from one another in such a way that the connection area between contact leg 42 and spring leg 41 of second connector element 40 can come to rest between the two holding bars 27*a*, 27*b* which can be arranged on side wall 21 such that they run essentially perpendicular to side wall 21. Spring leg 41 can extend approximately from one of the two longitudinal edges 21*a*, 21*b* to the other and runs in particular at an angle to them.

A supporting surface 26*b*, which makes it possible to support and fix contact 21 in printed circuit board connection terminal 60, can be arranged on longitudinal edge 21*b* essentially perpendicular to side wall 21. A stop edge 29 can be arranged on supporting surface 26*b*, in particular by bending out a part of stop surface 28 against which free end 41*b* of spring leg 41 abuts. When an electrical conductor is inserted in insertion direction E, spring leg 41 is deflected away from stop edge 29 against the force of the spring until the electrical conductor can be inserted into an intermediate space between supporting surface 26*b* and free end 41*b* of spring leg 41. The electrical conductor is then held on supporting surface 26*b* in a clamping manner by spring leg 41. To prevent the electrical conductor from being pushed in too far, a stop surface 28 can be arranged on supporting surface 26*b* essentially at a right angle thereto and to side wall 21.

FIGS. 7 and 8 show a further exemplary embodiment of a contact assembly 10' according to the present disclosure in a state in which it is inserted into a housing 61 of printed circuit board connection terminal 60.

Contact assembly 10' differs from the contact assembly 10 shown in FIGS. 3 and 4 essentially in the design of first connector element 30', which has one pair of contact elements in the case of the contact assembly 10 shown in FIGS. 3 and 4 and two pairs of contact elements in the case of the contact assembly 10' shown in FIG. 7.

In addition to the pair of contact elements of the exemplary embodiment shown in FIGS. 3 and 4, first connector element 30' of the contact assembly 10' shown in FIG. 7 has another pair of contact elements that is designed in particular as spring elements 31, 33 having a longitudinal axis 11, 13 and a free end 31, 33*a*. Free ends 31*a*, 33*a* are designed in particular such that they are slightly curved in shape, in particular designed to be curved away from plug-in contact 50 to simplify the insertion of plug-in contact 50. Spring elements 31, 33 can be designed analogous to spring elements 32, 34 and, in particular, each has a first section and a second section, the width of the first section at a right angle to the plug-in direction S being greater than the width of the second section at a right angle to the plug-in direction S. Spring elements 31, 33 can, for example, also have a T-shaped design.

In the present exemplary embodiment, spring element 31 and spring element 32 are arranged with respect to each other in such a way that their longitudinal axes 11,12 are arranged essentially parallel to each other and parallel to plug-in direction S, and spring elements 31, 32 are arranged one behind the other when viewed in plug-in direction S. In particular, longitudinal axes 11 and 12 are in alignment, while they are arranged spaced apart offset in parallel relative to a longitudinal axis 1S of plug-in contact 50. Free ends 31*a*, 32*a* of spring elements 31, 32 in particular face towards each other. When viewed from plug-in direction S, plug-in contact 50 first contacts spring element 31 and only then contacts spring element 32. The contact points of spring elements 31, 32 on the plug-in contact 50 inserted into first connector element 30 are situated along plug-in direction S or are also spaced apart from one another along longitudinal axis 1S of plug-in contact 50. This also applies analogously to spring elements 33 and 34.

In one embodiment, spring elements 31, 33 form a first pair of contact elements, while spring elements 32, 34 form a second pair of contact elements.

Spring elements 31 and 33 of the first pair of contact elements are aligned relative to each other in such a way that longitudinal axes 11, 13 run essentially parallel to one another and are arranged parallel to plug-in direction S. A gap is arranged between the two spring elements 31, 33 and thus also between their longitudinal axis 11,13 in such a way that plug-in contact 50 can be inserted between the two spring elements 31, 33 and spring elements 31, 33 bear against plug-in contact 50 under stress, in particular in such a way that the contact points are located approximately diametrically opposite on plug-in contact 50. Free ends 31*a*, 33*a* of spring elements 31, 33 are located in the rear when viewed in plug-in direction S such that free ends 31*a*, 34*a* of the second pair of contact elements and free ends 31*a*, 33*a* of the first pair of contact elements, the design of which was already described in detail on the basis of FIGS. 3 and 4, face towards each other.

Spring elements 31, 33 can also be arranged in one piece on contact 20'. As a modification to contact 20 of the exemplary embodiment shown in FIGS. 3 and 4, contact 20' also has an essentially rectangular recess in side wall 21 starting from longitudinal edge 21*a* into which spring elements 33, 34 protrude from opposite edges of the recess in such a way that free ends 33*a*, 34*a* of spring elements 33, 34 face each other.

In addition to the exemplary embodiment shown in FIGS. 3 and 4, a connection element 22, in which an opening 23 is arranged, through which plug-in contact 50 can be inserted into contact 20 in plug-in direction S and, in particular, through which first connector element 30' can be inserted, can be arranged on face edge 21*c* of side wall 21 such that it is essentially perpendicular to side wall 21. On connection element 22, spring element 31 can be arranged essentially perpendicular to the surface of connection element 22 in such a way that spring element 31 is oriented essentially parallel to spring element 33. In particular, spring elements 31, 33 are arranged in mirror symmetry with respect to each other.

It can be seen in FIGS. 7 and 8 that contact 20' is supported in the interior of housing 61 by supporting surfaces 26*b* and contact surfaces 25*a*, 25*b* as well as holding bar 27*b*. Connection element 22 essentially extends across the entire width of housing 61. Plug-in contact 50 is inserted through opening 23 of connection element 22 into printed circuit board connection terminal 60, where it is fixed in a clamping manner by spring elements 31, 32, 33, 34 of first connector element 30'. Printed circuit board connection terminal 60 is referred to as a plug-in printed circuit board connection terminal 60 because printed circuit board connection terminal 60 can be placed onto plug-in contact 50 to produce an electrically conductive connection with a device. For this purpose, plug-in contact 50 is connected, for example, to the corresponding device in an electrically conductive manner via soldering surface 52 and fixedly attached thereto.

Housing 61 has an entrance opening 63 through which an electrical conductor can be inserted into housing 61 in insertion direction E. In particular, this occurs against the force of spring leg 41. To be able to release the electrical conductor from connection terminal 60 again, connection terminal 60 can have an actuation element 64 by means of which spring leg 41 can be deflected farther against the spring force when actuation element 64 is actuated, in particular so far that free end 41*b* releases a clamped electrical conductor again, which subsequently allows the latter to be removed. Housing 61 can have a test opening 65 through which a voltage tester can be inserted into housing 61 to check whether a voltage is being applied to contact assembly 10'.

As can be seen in particular in FIG. 5, printed circuit board connection terminal 60 has a plurality of, in particular four, connection terminals arranged next to each other. For this purpose, housing 61 has four entrance openings 63, four actuating elements 64 and four test openings 65. Four contact assemblies 10' are, as shown in FIG. 7, arranged in housing 61 next to each other and separated from each other by electrically insulating walls. Four plug-in contacts 50, in particular the four plug-in contacts 50 of the pin header 70 shown in FIG. 6, can be plugged into printed circuit board connection terminal 60 through four adjacent openings 23.

LIST OF REFERENCE CHARACTERS

10 contact assembly
10' contact assembly
20 contact
20' contact
21 side wall
21*a* longitudinal edge
21*b* longitudinal edge
21*c* face edge
21*d* face edge
22 connection element
23 opening
24 connection element
25*a* contact surface
25*b* contact surface
26*a* supporting surface
26*b* supporting surface
27*a* holding bar
27*b* holding bar
28 stop surface
29 stop edge
30 first connector element
30' first connector element
31 spring element
31*a* free end
32 spring element
32*a* free end
321 first section
322 second section
33 spring element
33*a* free end
34 spring element
34*a* free end
341 first section
342 second section
40 second connector element
41 spring leg
41*b* free end
42 contact leg
11 longitudinal axis
12 longitudinal axis
13 longitudinal axis
14 longitudinal axis
1S longitudinal axis
S plug-in direction
E insertion direction
50 plug-in contact
52 soldering surface
60 printed circuit board connection terminal
61 housing
63 entrance opening
64 actuating element
65 test opening
70 pin header
72 insulator
80 contact
82 first connector element
84 spring elements
86 second connector element
88 spring leg a distance
d diameter
b321 width
b322 width
b341 width
b342 width

What is claimed:

1. An electrical contact assembly of a plug-in connection terminal, comprising:

an electrical contact having a first connector element for connecting a plug-in contact in a plug-in direction, a second connector element for connecting an electrical conductor in a clamping manner being arranged on the electrical contact, wherein the first connector element has a contact element that has a first section and a second section, wherein a width of the first section at a right angle to the plug-in direction is greater than a width of the second section at a right angle to the plug-in direction; and wherein the plug-in contact can be plugged into the electrical contact assembly at a plurality of positions, each position of the plurality of positions spaced from an adjacent position by a distance at a right angle to the plug-in direction and the width of the first section is at least as great as the distance plus a diameter of the plug-in contact to be connected.

2. An electrical contact assembly of a plug-in connection terminal, comprising:

an electrical contact having a first connector element for connecting a plug-in contact in a plug-in direction, a second connector element for connecting an electrical conductor in a clamping manner being arranged on the electrical contact, wherein the first connector element has a contact element that has a first section and a second section, wherein a width of the first section at a right angle to the plug-in direction is greater than a width of the second section at a right angle to the plug-in direction;

wherein the width of the first section is at least twice as great as a diameter of the plug-in contact to be connected.

3. The electrical contact assembly according to claim 2, wherein the plug-in contact can be plugged into the electrical contact assembly at a plurality of positions, each position of the plurality of positions spaced from an adjacent position by a distance at a right angle to the plug-in direction and the width of the first section is at least as great as the distance plus a diameter of the plug-in contact to be connected.

4. The electrical contact assembly according to claim 1, wherein the first section comprises an area of the contact element that rests against the plug-in contact when the plug-in contact is plugged in.

5. The electrical contact assembly according to claim 1, wherein the contact element is a spring element having a free end.

6. The electrical contact assembly according to claim 5, wherein the first section is arranged in an area of the free end.

7. The electrical contact according to claim 5, wherein the free end of the spring element is curved away from the plug-in contact to be connected.

8. The electrical contact assembly according claim 5, wherein a longitudinal axis of the spring element runs approximately parallel to the plug-in direction of the plug-in contact.

9. The electrical contact assembly according to claim 1, wherein the first connector element has a pair of contact elements;

wherein the electrical contact has a side wall in which a first contact element of the pair of contact elements is arranged, and in that a first connection element on which a second contact element of the pair of contact elements is arranged approximately perpendicular to the side wall.

10. An electrical contact assembly of a plug-in connection terminal, comprising:

an electrical contact having a first connector element for connecting a plug-in contact in a plug-in direction, a second connector element for connecting an electrical conductor in a clamping manner being arranged on the electrical contact, wherein the first connector element has a contact element that has a first section and a second section, wherein a width of the first section at a right angle to the plug-in direction is greater than a width of the second section at a right angle to the plug-in direction;

wherein the first connector element has a pair of contact elements;

wherein the electrical contact has a side wall in which a first contact element of the pair of contact elements is arranged, and in that a first connection element on which a second contact element of the pair of contact elements is arranged approximately perpendicular to the side wall.

11. An electrical contact assembly of a plug-in connection terminal, comprising:

an electrical contact having a first connector element for connecting a plug-in contact in a plug-in direction, a second connector element for connecting an electrical conductor in a clamping manner being arranged on the electrical contact, wherein the first connector element has a contact element that has a first section and a second section, wherein a width of the first section at a right angle to the plug-in direction is greater than a width of the second section at a right angle to the plug-in direction;

wherein the first connector element has a plurality of pairs of contact elements arranged one behind each other in the plug-in direction of the plug-in contact.

12. The electrical contact assembly according to claim 11, wherein each of the pairs of contact elements has two spring elements that are arranged relative to each other in such a way that two spring elements rest against two diametrically opposite points of the plug-in contact when the plug-in contact is connected.

13. The electrical contact assembly according to claims 12, wherein free ends of the spring elements of the first pair of contact elements in the plug-in direction of the plug-in contact and free ends of the spring elements of the second pair of contact elements in the plug-in direction of the plug-in contact face towards each other.

14. The electrical contact assembly according to claim 11, wherein the electrical contact has a side wall in which a first contact element of the first pair of contact elements in the plug-in direction of the plug-in contact and a first contact element of the second pair of contact elements in the plug-in direction of the plug-in contact are arranged, and in that a first connection element, on which a second contact element of the first pair of contact elements in the plug-in direction of the plug-in contact is arranged approximately perpendicular to the side wall, and that a second connection element, on which a second contact element of the second pair of contact elements in the plug-in direction of the plug-in contact is arranged approximately perpendicular to the side wall.

15. The electrical contact assembly according to claim 1, wherein the second connector element has a spring leg.

16. The electrical contact assembly according to claim 1, wherein the electrical contact is one piece.

17. The electrical contact assembly according to claim 1, wherein the electrical contact is a stamping and bending element.

18. A connection terminal having an electrical contact assembly according to claim 1.

19. A printed circuit board connection terminal having a plurality of electrical contact assemblies according to claim 1.

20. The electrical contact assembly according to claim 1, wherein the first connector element has a plurality of pairs of contact elements arranged one behind each other in the plug-in direction of the plug-in contact.

* * * * *